United States Patent [19]

Krause

[11] Patent Number: 5,038,026

[45] Date of Patent: Aug. 6, 1991

[54] INPUT AMPLIFIER FOR THERMALLY VIEWING DEVICE WITH PHOTORESISTOR

[75] Inventor: Gerhard Krause, Rosenheim, Fed. Rep. of Germany

[73] Assignee: Steinheil Optronik GmbH, Ismaning, Fed. Rep. of Germany

[21] Appl. No.: 389,684

[22] Filed: Aug. 4, 1989

[30] Foreign Application Priority Data

Aug. 12, 1988 [DE] Fed. Rep. of Germany ....... 3827465

[51] Int. Cl.$^5$ .................. H01L 25/00; H01J 40/14
[52] U.S. Cl. ......................... 250/208.1; 250/214 A; 250/332
[58] Field of Search .............. 250/338.4, 332, 338.1, 250/214 RC, 214 SW, 214 A, 214 R, 208.1; 307/311

[56] References Cited

U.S. PATENT DOCUMENTS

| | | | |
|---|---|---|---|
| 4,173,723 | 11/1979 | Temes et al. | 250/214 R |
| 4,567,363 | 1/1986 | Goodnough | 250/214 A |
| 4,659,928 | 4/1987 | Tew | 250/332 |
| 4,733,077 | 3/1988 | Gaalema et al. | 250/338.1 |
| 4,791,286 | 12/1988 | Wall | 250/214 A |
| 4,868,902 | 9/1989 | Sato | 250/332 |

FOREIGN PATENT DOCUMENTS 3615925 11/1987 Fed. Rep. of Germany ... 250/214 A

Primary Examiner—David C. Nelms
Assistant Examiner—Michael Messinger
Attorney, Agent, or Firm—Kanesaka & Takeuchi

[57] ABSTRACT

A circuit arrangement for infrared detectors, more especially for thermal viewing devices with photoresistors as detector elements is designed in order so as not to necessitate an input amplifier and an output amplifier for each detector. For this purpose the collector current of a transistor is integrated for a scan period in a capacitor and at the end of the scan period the capacitor is discharged through an electronic switch to a present potential.

9 Claims, 4 Drawing Sheets

INPUT AMPLIFIER FOR THERMALLY VIEWING DEVICE WITH PHOTORESISTOR

BACKGROUND OF THE INVENTION

The invention relates to a circuit arrangement for infrared detectors, and more especially for a thermal viewing device with photoresistors as detector elements.

Highly sensitive devices for detecting infrared radiation, more especially thermal viewers, have a detector which consists of a plurality of independent detector elements. In the present state of the art in the wave length range around 10 microns the maximum number of detector elements is limited to approximately 300. For this reason the image has to be optically scanned. In the wave length range around 4 microns there are admittedly detectors with 250,000 detector elements. The quantum efficiency of these detectors is however so poor that for highly sensitive devices in this range as well the image is scanned with a substantially smaller number of detector elements.

In the present state of development CCD detectors for the above-mentioned infrared range operating on the electronic scan principle are not available. Therefore each detector element is provided with a input amplifier and an output amplifier.

Furthermore in these wave length ranges the technology of the production of detector zones with photodiodes have not been fully developed. For this reason photoresistors are used for the detector elements. The amplifiers thus have to be optimized for photoresistors as signal sources.

Owing to the large number of channels, for instance 288, in current technology a large number of amplifier systems are involved: 288 input amplifiers and 288 output amplifiers are required. A further point is that the amplifiers are capacitively coupled so that a large number of coupling capacitors are required as well.

The capacity of the coupling capacitors is comparatively large since the scan frequency only amounts to 50 Hz. For this reason a compromise is often made and the coupling capacitors are not made large enough, this leading to undesired pulse tilts in the signal.

A still further disadvantage in the known devices is that the 288 channels are only combined by a multiplexer to one channel after the output amplifier. At this point of combination the signal level is already comparatively high. This means that the setting means for brightness and contrast have to be arranged on the input side of the multiplexer in order to obtain the necessary dynamic range of signal transmission. Accordingly it is necessary to have at least 576 setting members which have to be in synchronism with each other. In the present state of development however, such synchronism is 30 difficult to achieve.

SUMMARY OF THE INVENTION

One object of the present invention is to devise a circuit arrangement of the initially described type with which the above disadvantages may be overcome.

In order to achieve this or other objects appearing from the present specification, claims and drawings the collector current of a transistor during a scanning period is integrated in a capacitor and at the end of the scanning period the capacitor is discharged via an electronic switch to a preset potential.

Advantageous further developments of the invention are described in the claims.

Owing to the relatively small number of components the circuit arrangement in accordance with the invention is simple in structure and accordingly requires only a small amount of space. It provides a good noise margin. The circuit arrangement does not require any coupling capacitors.

In the circuit arrangement in accordance with the invention the integrator and the multiplexer form a characteristic functional unit. The integrator with periodic discharge has a satisfactory filtering effect so that complex filter circuits are not required in the input amplifiers and the discharge switch of the integrator may at the same time be used as a multiplexer, so that there are the following advantages:

(a) The combination of the 288 channels by a multiplexer takes place relatively speaking at the front end of the signal path. Accordingly the number of the components required and thus the overall size is small. Furthermore, there is economy as regards the power supply.

(b) The setting members for the adjustment of contrast and—even more important—the adjustment of brightness modify the signal even after a comparatively small amount of amplification (100 fold amplification). This ensures a very large dynamic range of a thermal viewing device. The device makes it possible to represent every object temperature in a range of −50° C. to +70° C. on the picture screen of the monitor at any desired gray values—that is to say without saturation or overcontrol. This property is present in the case of all settings of the contrast controller, that is to say even during maximum amplification. The setting members for the brightness and the contrast may be arranged in the common amplifier section (main amplifier) so that there is no streaking caused by the synchronism effect of setting members.

(c) In accordance with the invention the entire signal path, from the detector to the output, may be DC coupled. Coupling capacitors, which in the case of low scan frequencies would lead to pulse tilts in the signal, are not present. Another point is that the problem of recovery times after substantial saturation does not arise.

(d) There is the advantage that the signal processing system has a clamping function as used in television engineering. In this case the reference temperature as selected by the operator is adhered to even if on slewing the device or when the object temperatures are changed the signals are changed.

This latter property is particularly important when training the viewer on rapidly moving objects. It necessary in order to provide a large dynamic range of the circuit arrangement in accordance with the invention and for the use of the full circuit sensitivity under all conditions of operation; e.g., in a high-contrast scene where the full amplification is nevertheless set in order to recognize an object with a low local contrast, with the temperatures of the object considerably departing from the mean temperature of the scene.

The above described clamping function furthermore serves the purpose of setting the resulting offset voltages of the amplifiers at zero.

Further details of the circuit arrangement in accordance with the invention will be seen from the ensuing detailed description of embodiments shown in the drawing.

DETAILED DESCRIPTION OF PREFERRED EMBODIMENTS

Figure 1:
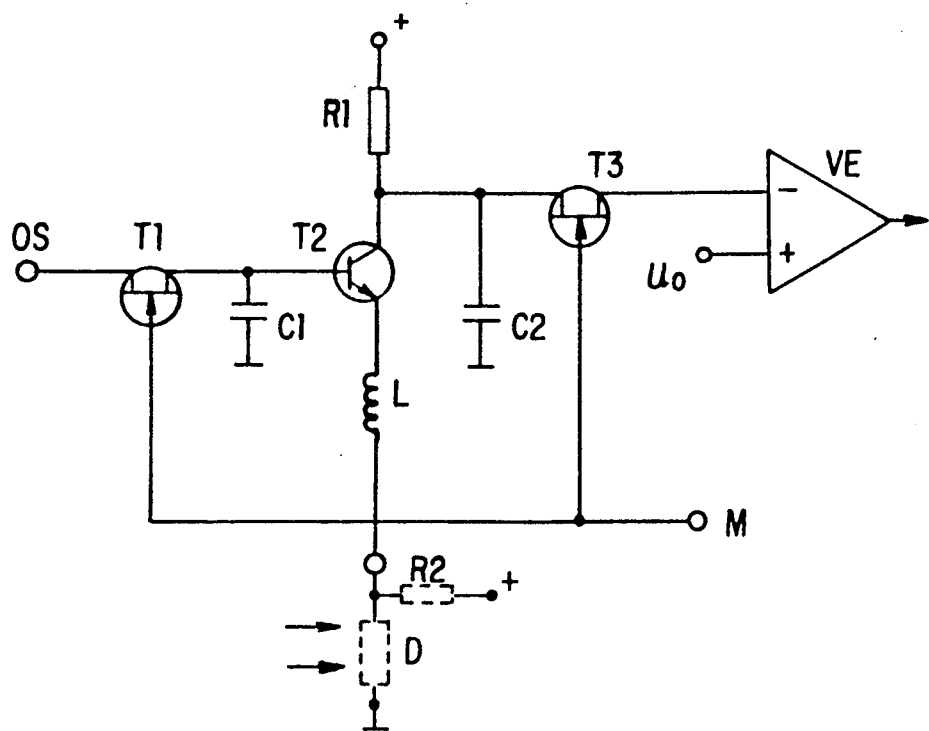
FIG. 1 shows a first schematic of a circuit in accordance with the invention.

FIG. 1 shows a circuit arrangement in accordance with the invention by way of example.

One of the 288 detectors D is placed in series with an inductance L on the emitter line of a transistor T2, whose base is connected with an electronic switch T1 and with a capacitor C1 as parts of a voltage regulating circuit. The electronic switch T1 is supplied with a regulating voltage OS. The collector DC for the transistor T2 is supplied via a resistor R1. A capacitor C2 and an electronic switch T3 are connected with the collector of the transistor T2, the output signals of the switch T3 being supplied to the one input of a discharge amplifier VE. A control voltage is present at the input M in order to operate the electronic switches T1 and T3.

The transistor T2 amplifies the signal voltage of the detector D. The time constant (R1.C2) exceeds a scanning period between two consecutive detectors. For this reason the circuit arrangement operates as an integrator for the photocurrent supplied from the detector D. The signal current stored during a scan period in the capacitor C2 is discharged during the short scan time (approximately 40 ns) via the electronic switch T3 (multiplexer) down to the reference voltage $U_O$. For this purpose the input stage of the amplifier VE has an active input resistor, which accelerates recharging. Only one common amplifier VE is required for all the 288 channels. The mean DC for the transistor T2 is supplied via the resistor R1 so that only the signal currents flow via the switch T3.

Figure 2:
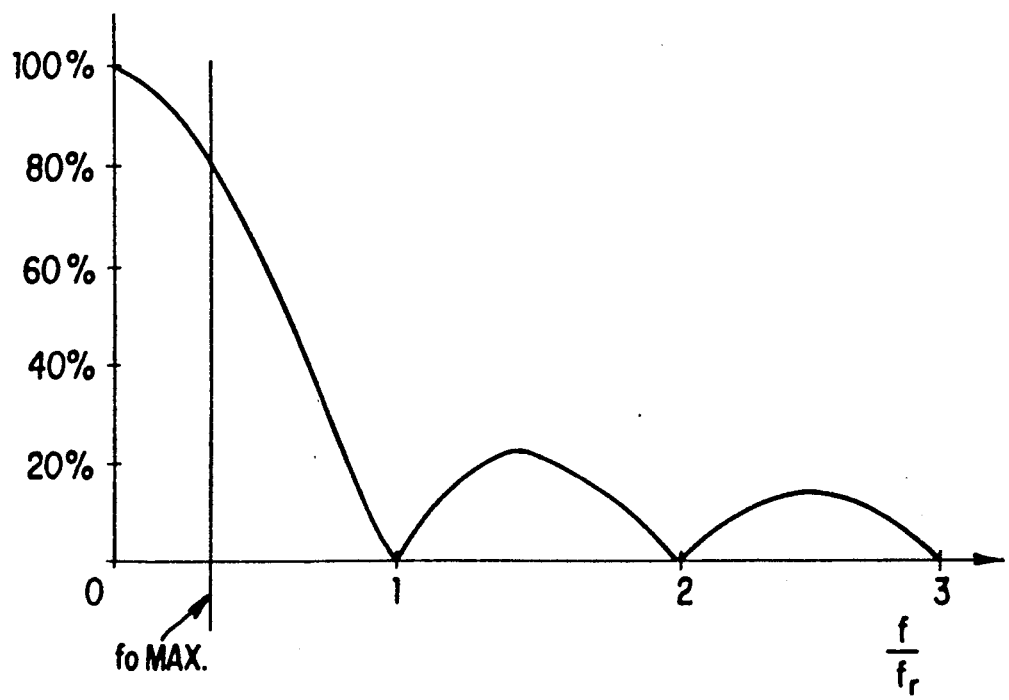
FIG. 2 is a graph to indicate the filtering properties of the circuit arrangement with periodic discharge.

Despite its simplicity this circuit has a high quality filtering action. FIG. 2 shows the relative frequency response of the capacitor C2 together with the switch T3. The influence of the inductance L is thus not taken into account.

The frequency standardized for the column scan frequency $f_T$ is represented on the horizontal axis. The maximum signal frequency $f_{omax}$, which contains the optical information, amounts to 26.25 kHz. This frequency is also plotted in FIG. 2.

The frequency range $0.5.f_{omax}$ and the first zero digit of the frequency response function, which only comprises noise, is suppressed by filters which are connected on the output side of the multiplexer T3. Undesired frequencies above this first zero digit would be mirrored by the sampling process at half the sampling frequency and would thus come in the useful signal range. For this reason these frequencies are additionally damped with the inductance L on the emitter line of the transistor T2 in a frequency-dependent manner. In accordance with the invention an even greater damping effect may be achieved if a blocking circuit is produced by connecting a capacitor in parallel to the inductance L. The frequency drop in the useful signal range is corrected by a enhancing member in the main amplifier.

When assessing the necessary filter damping effect it is to be taken into account that the addition of the noise components is a square law one so that the influence of damped frequency regions on the overall noise is overproportionally reduced.

In accordance with the invention the detector D is arranged on the emitter line of the transistor T2. This arrangement offers the advantage that the tolerances of quantum efficiency and resistance of the detector element are not added. The differences between the signals at the output of the individual 288 input amplifier channels are thus less than those of the conventional base control. Although the power amplification of the base circuit arrangement is less than that of the emitter circuit, it amply satisfies the present purpose.

In the case of the present conditions the signal to noise separation, which may be obtained with the two possible basic circuits, is the same.

In the case of very low frequencies the circuit does offer the advantage that the effective external resistance in the base circuit is practically zero. In a corresponding manner the base current-flicker noise is very low, unlike the case of circuits with coupling capacitors in the base circuit, because in the latter case the impedance of the coupling capacitors greatly increases at very low frequencies.

The Mosfet T3 operating as a multiplexer switches the signal to the common output which is common to all input amplifier channels. GaAs-FETs are used as switches, because they offer short switching times, low switch on resistances, low switch interference voltages and very low cross talk between the input and the output. Nevertheless in comparison with the smallest signal the switch interference is not negligible. This residual interference however only acts like an offset voltage of the amplifiers and it is thus cancelled out by the offset voltage regulating circuit in accordance with the invention.

Figure 4:
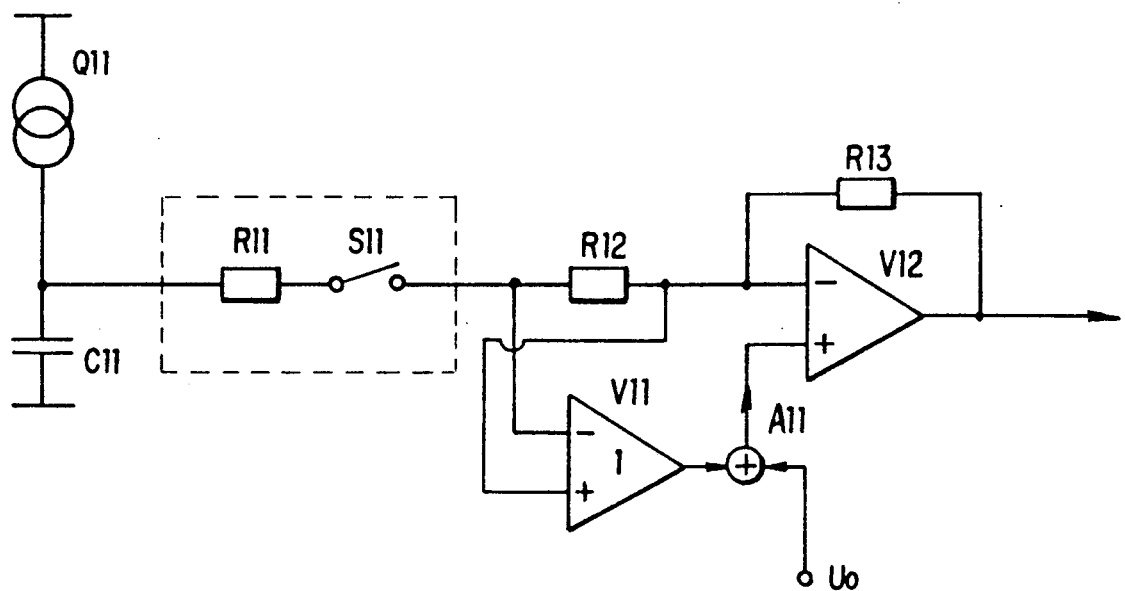
FIG. 4, FIG. 5.
Figure 5:
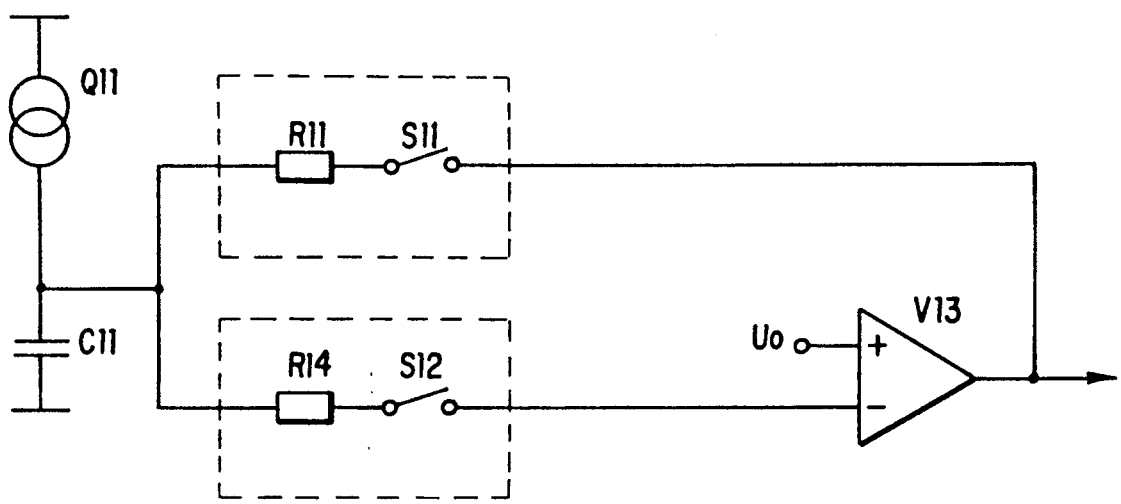
Figure 6:
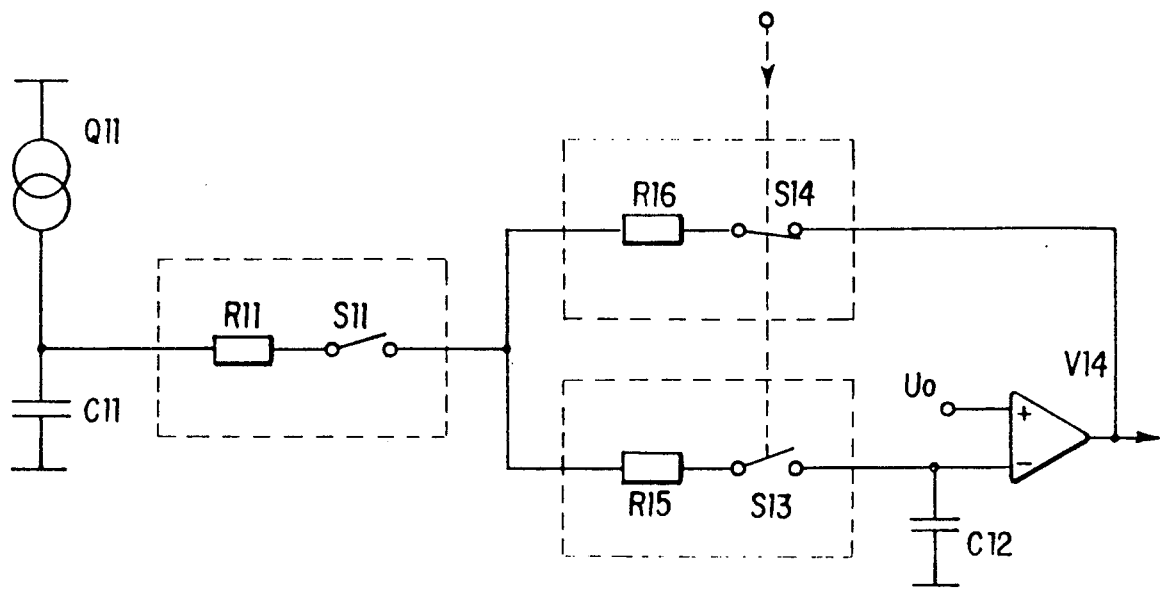
FIG. 6 show various high speed discharge circuits as parts of the circuit arrangement in accordance with the invention.

The components T1 and C1 belong to the offset voltage regulating circuit. The FET T1, which may also be a bipolar transistor, switches the regulating voltage OS in each case to the capacitor C1 for a short time. This capacitor stores the information until the next time switching takes place. The offset voltage regulator adjusts the voltage OS until at the collector of the transistor T2 and at the time when the clamp area is scanned, the voltage $U_0$ is present. The recharging of the capacitor C1 may be accelerated by an external, active circuit which is common for all the 288 channels such as shown in FIG. 4, 5 or 6.

Figure 3:
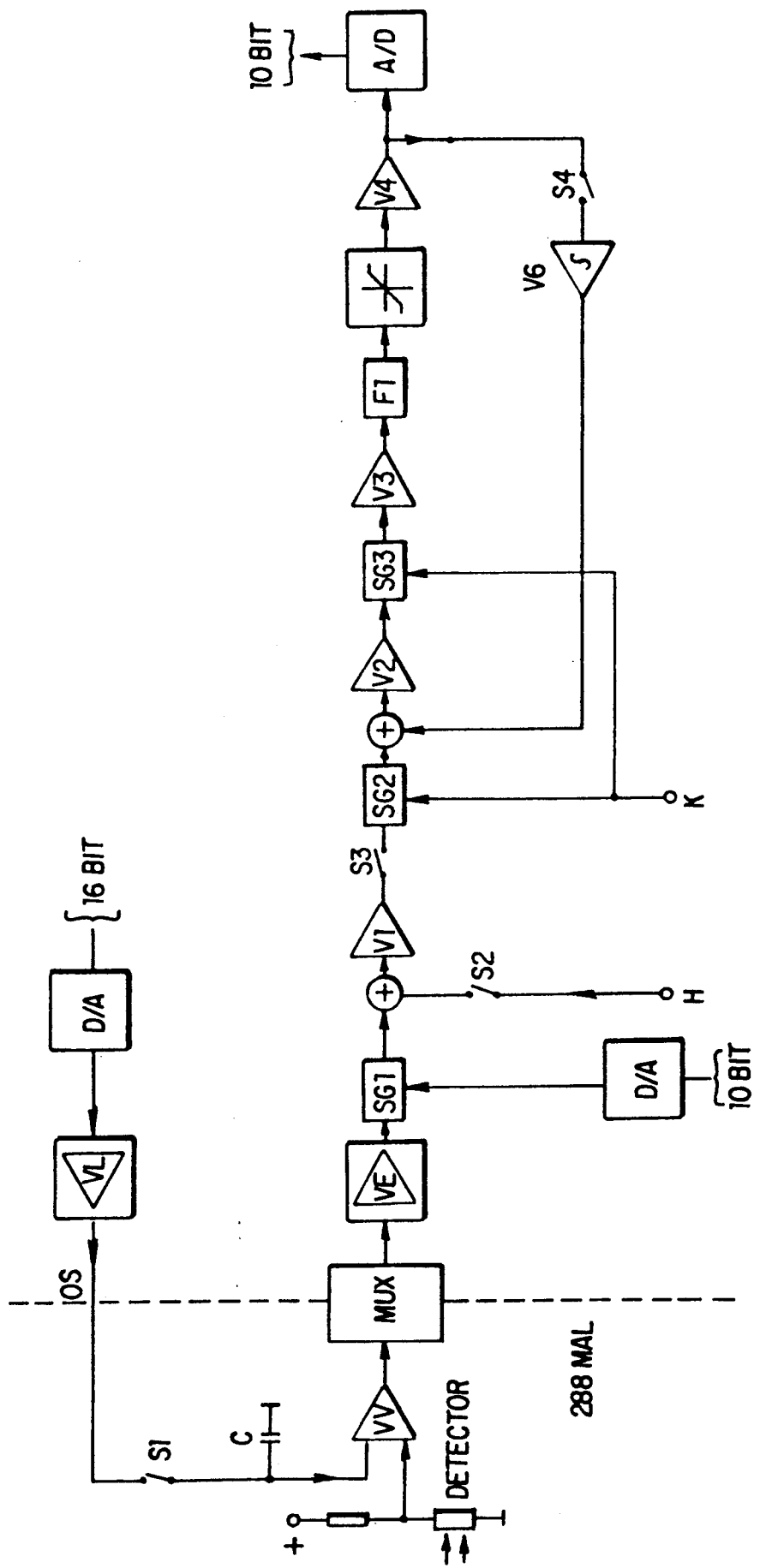
FIG. 3 is a block schematic of the full signal path, for example in a thermal viewer as far as the output of the output amplifier, comprising the circuit arrangement in accordance with the invention.
Figure 7:
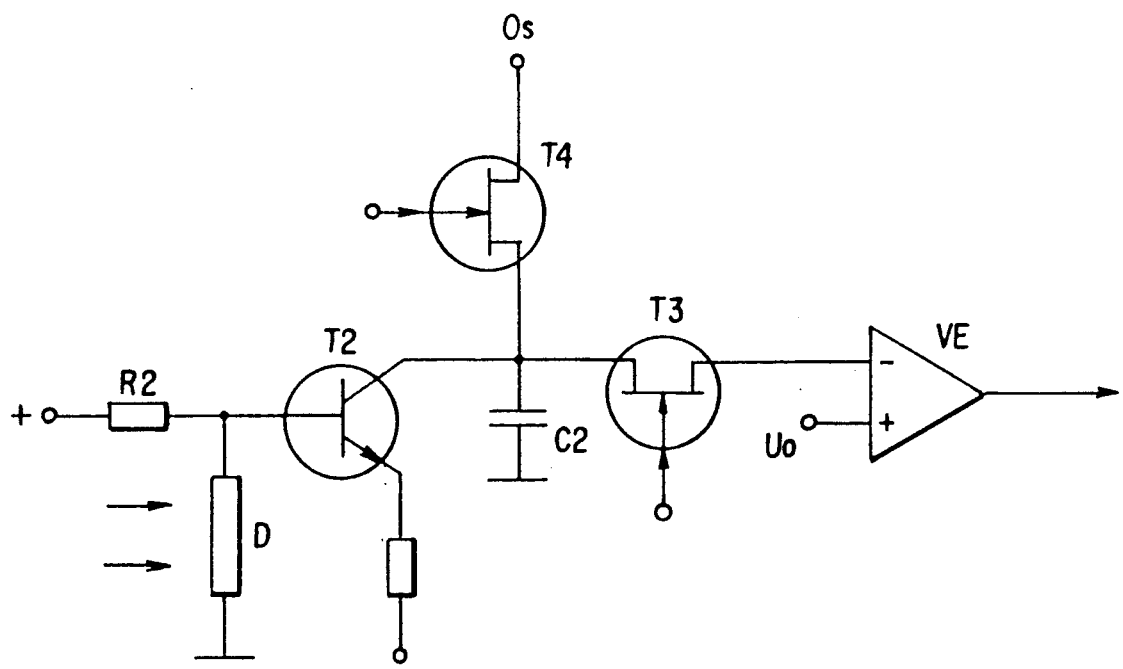
FIG. 7 is a further circuit schematic of a circuit arrangement in accordance with the invention.

FIG. 3 shows the block schematic for analog signal processing in a thermal viewer. The elements to the left of the broken line each have an associated detector element so that 288 of them are required. On the other hand in the section to the right of this the signals from all the 288 detector elements are processed sequentially. Accordingly only one of each of these functional elements of this section is required. The elements to the left of the broken line comprise the circuit arrangement according to the invention instance as shown in FIG. 1 or FIG. 7. The main parts of this circuit arrangement are shown in FIG. 1. The amplifier VV denoted as the input or preamplifier is formed by cooperation of the multiplexer T3, the transistor T2, the resistor R1, the inductance L and the capacitor C2.

The output of the multiplexer T3 controls the discharge amplifier VE, which converts the charge of the capacitors of the input amplifiers into a voltage. The charge is proportional to the detector signal. Furthermore this amplifier has to reconvert the charge of these capacitors back to a defined value. It is followed by the setting member SG1, which performs the individual amplification regulation of the 288 channels.

On the output side of the setting member SG1 the signal H coming from the brightness regulator is added. The prefix sign of the brightness signal is in this respect always such that the amplitude of the signal which is to undergo further processing is set to a value near to the amplitude of the signal present on scanning the clamp area. This is necessary because the signal background, which is substantially eliminated by these features, is greater by many powers of ten than smallest possible detectable signal. Thus the following stages only have to meet simple requirements for the high level signal behavior.

The electronic switch S2 closes when the image is being scanned. It is open when the clamp areas are being scanned and during scan flyback.

The following amplifiers V1, V2 and V3 are very broad band (100 MHz) ones. It is particularly important that their recovery time after saturation be very much smaller than the signal duration for one pixel. This is necessary since at large gains while examining high-contrast images saturation may not be avoided in significant parts of the image. The short recovery times ensure that there is no smearing after the saturated parts of the image.

More particularly the amplifier V1 is very low in noise as well since the noise band width of the common channel is greater than that of the ampifiers by a factor of approximately 300.

The setting members SG2 and SG3 are used for setting the gain. For this purpose the contrast signal K is fed in. The filter F1 limits the band width to approximately 25 MHz which is essential for the multiplex transmission. This is necessary in order to ensure that the amplitude of the noise arising on the output side of the multiplexer is negligible in comparison with the noise from the detector. The broad of noise produced in the common channel is admittedly much wider than that of the input amplifier noise, but without a low pass filter it would be mirrored at the non-linear characteristic of the limiter B irreversibly into the useful signal range.

At the output the limiter B supplies a signal amplitude which is matched to the dynamic range of the A/D converter. It is in this manner that saturation of the A/D converter is avoided. The recovery time of the A/D converter is larger than that of the limiter B. Without a limiter there would thus be a possibility of crosstalk between signals not well separated in time, because owing to the interlaced scan and of the column scan method selected signals close to each other in time correspond to pixels which are not close to each other in space.

The amplifier V4 drives the A/D converter. The setting signal OS of the offset voltage regulating circuit sets the voltage at the output of the amplifier V4—while the clamp areas are being scanned—to a given reference voltage.

A further regulating circuit in accordance with the invention acting via the components S4 and V6 serves to ensure offset voltage matching of the amplifier chain V2 through V4; this regulating circuit operates during the return time of the scanner. For this purpose the switch S3 is opened during this time and switch S4 is closed; then the integrator V6 regulates to avoid deviation until the voltage at its input (=output V4) is equal to zero. This is important for amplifiers with a large dynamic range so that when the gain is adjusted by hand using the contrast signal K there is no modification of direct currents (offset voltages), for this would lead to the regulating circuit via S2 drifting out of the equilibrium condition for a few seconds when the manual regulator is used.

On account of the special importance for signal processing in a thermal viewer the offset voltage regulating circuit in accordance with the invention will be explained again in context.

The offset voltage regulating circuit makes possible DC coupling from the detector as far as the output of the main amplifier since the resulting offset voltage is adjusted to zero. Furthermore, this regulator performs a function otherwise only fulfilled by the clamping circuit.

An average value is produced from the digitalized output signal of the main amplifier, while the clamp area is being scanned, in the system controller for a large number of scan periods for each channel. This average value is used to compute a correction signal OS so that on scanning the clamp area the amplitude of the signal at the output of the input amplifier is of equal size in all channels. For this purpose after conversion into the analog setting quantity OS, signal is supplied to the transistor T1 operating as the regulation voltage multiplexer. This switch T1 becomes conducting for 40 ns so that during this time the capacitor C1 is charged up to the instantaneous value of the regulation voltage OS. In order to accelerate recharging there is an active charge circuit which is omitted from the figures. A charging circuit is then required for all the input amplifier channels.

The optical reference area to the left of the image to be scanned is used as reference radiation source of the offset regulating circuit. A corresponding area is arranged to the right of the image, which is about 10 K. warmer than the left hand area. In a more elaborate system the temperature may be matched to a respectively set temperature window by heating or cooling. This area is the radiation reference area for regulating circuit, which compensates for the different sensitivities of the individual detector elements by influencing the transmission factor of the setting member SG1. The computation of the setting quantities and the driving of the corresponding D/A converter is performed by the system controller.

When the regulator has become operational the amplitudes of the individual channels at the output of the setting member SG1 are all the same in size when the radiation reference area is scanned. In order to ensure that the reference signal has the optimum magnitude, during this time the gain of the main amplifier is altered for a short time by acting on the control signal for the setting members SG2 and SG3. (The main amplifier is the amplifier circuit including the amplifiers VE to V4).

The invention is not limited to the working embodiments. In particular, the resistor R1 in FIG. 1 may be replaced by a source of current. Furthermore in lieu of the electronic switches T1 and T3 in FIG. 1 other components operating as switches may be used. As described in connection with FIG. 1, the arrangement of the detector D in an emitter circuit offers advantages. However as a general point the detector may also be placed in a base circuit as is in fact shown in FIG. 7. However in this case more components would be needed, even if the offset regulating voltage OS is supplied to the base. Furthermore the electronic circuits T1 and T3 may be turned on at times different from those in accordance with FIG. 1.

Lastly it is also possible to dispense with the resistor R1 in FIG. 1 or with the current source equivalent thereto. The charging loss of the capacitor C2 due to the DC of the transistor T2 is then replaced for a short time (that is to say short in relation to the scan period duration) using an electronic switch, as is shown in FIG. 7. As a general point this may take place by using the electronic switch T3. However, with the components presently available it is however difficult to replace large charges without interfering with the evaluation of the very much smaller signal charge. For this reason it is better to provide a second electronic switch T4, which performs the charge equalization for the transistor DC at a time at which the electronic switch T3 is off. The charge level for the charge equalization for the transistor DC may be regulated with the aid of the above described offset voltage regulator. In this case it is possible for the sample and hold circuit T1 and C1 in the base circuit of the transistor T2 to be dispensed with.

Owing to the relatively short available recharging time for the capacitors C1 and C2 respectively, it is advantageous to use recharging circuits in accordance with the invention, with which these capacitors may be recharged at times which are much smaller than the product (C1.R11) and, (C2.R11) respectively,. In this case R11 is the undesired resistance of the electronic switch in the turned-on condition of the switch.

FIG. 4 shows such an active high-speed recharging circuit. The collector current of the transistor T2, its base current and other leakage currents are here symbolized by the current source Q11. The capacitor C11 to be recharged (corresponding to C2 in FIG. 1) is discharged via the electronic switch S11 with the internal resistance R11. The discharge current causes a voltage drop at the resistor R12. After reversal of the prefix sign in the amplifier VII this voltage drop will be at the input of the amplifier V12. The prefix sign of this feedback is so selected that the amplifier via the resistors R13 and R12 supplies a voltage which increases the recharging current. Owing to the selection of the resistors R12 and R17 the negative internal resistance of the recharging circuit may be set. And, owing to the unavoidable inaccuracies, however, the resulting discharge resistance may only in practice be decreased by a factor of 10. The voltage, to which the capacitor C11 is recharged, is preset by the reference voltage $U_o$. A11 is a summating stage.

FIG. 5 shows a high speed recharging circuit with which the resulting discharge resistance may be reduced by a factor or more than 50 even in the case of extremely short recharging times. Via a second electronic switch S12 and R14 the instantaneous difference between the voltage at the capacitor C11 and the reference voltage $U_o$ is determined and a voltage, which conforms to this difference is applied by the amplifier V13 to the electronic switch S11 (through which the recharging current flows) which increases the recharging current.

In the case of the circuit of FIG. 5 an additional electronic switch S12 is required in each input amplifier. In the high speed recharging circuit as in FIG. 6 electronic switches S13 and S14 are provided, of which only one is needed. These two switches operate in a complementary manner to each other, that is to say when one of the switches is closed the other will be open. During the discharge time (of for instance 40 ns) the switches S13 and S14 are switched a large number of times (for instance with an interval of 2 ns). During the sensor time section the capacitor C12 (which is very much smaller than the capacitor C11) will charge to the voltage which is present at the capacitor C11. At the output of the amplifier V14 there will be a voltage, which is proportional to the difference between the voltage at the capacitor C11 and the reference voltage $U_o$. In the other time slot, the generator time slot, this voltage will be applied to the electronic switch S11. Since the level of the amplifier output voltage is very much larger than and the prefix sign is opposite to that of the reference voltage $U_o$ like the voltage at the capacitor C11, the recharging operation is speeded up.

I claim:

1. An input amplifier for a thermally viewing device with a photoresistor, comprising:
    a bipolar transistor (T2) having an emitter connected to said photoresistor;
    an integrating capacitor (C2) connected to a collector of said bipolar transistor so that a collector current of said transistor is integrated in said integrated capacitor for a scan period;
    discharge means having an electronic switch (T3) connected to said collector for discharging said capacitor at an end of said scan period to a preset potential;
    said discharging taking place in a discharge period which is much shorter than said scan period; and
    said collector current being evaluated during said discharge period as a measure of a pixel amplitude.

2. The input amplifier of claim 1, which further comprises a resistor (R1) or current source equivalent thereto which is connected to said collector of said bipolar transistor (T2).

3. The input amplifier of claim 1, which further comprises an inductor (L) connected in series with said photoresistor and said emitter.

4. The input amplifier of claim 1, which further comprises an offset voltage regulating circuit (T1, C1) connected to a base of said bipolar transistor (T2) for periodically setting a base potential so that a charge in said capacitor (C2) has a preset value at an end of said scan period on scanning a clamp area.

5. The input amplifier of claim 1, wherein said discharge means further comprises an active discharge circuit connected to said capacitor (C2) via said electronic switch (T3) for shortening said discharge period.

6. A thermally viewing device comprising:
    a plurality of photoresistors;
    a plurality of input amplifiers each connected to one of said photoresistors;
    a signal processor connected to said input amplifiers;
    said signal processor including:

a chain of amplifiers (V2-V4); p1 a regulating circuit (S4, V6) connected across said amplifier chain (V2-V4) for setting an offset voltage to an input of said amplifier chain to be zero.

7. The thermally viewing device of claim 6, wherein said input amplifiers each comprise:

a bipolar transistor (T2) having an emitter connected to a series circuit consisting of one of said photoresistors and an inductor (L) and a collector connected to a resistor or current source equivalent thereto;

an integrating capacitor (C2) connected to said collector so that a collector current of said bipolar transistor is integrated in said integrating capacitor for a scan period;

a multiplexer having an electronic switch (T3) connected to said collector for discharge said capacitor at an end of said scan period to a preset potential in a discharge period which is much shorter than said scan period so that said collector current is evaluated during said discharge period as a measure of a pixel amplitude; and an offset voltage regulating circuit (T1, C1) connected to a base of said bipolar transistor (T2) for periodically setting a base potential so that a charge in said integrating capacitor (C2) has a preset value at an end of said scan period on scanning a clamp area.

8. An input amplifier for a thermally viewing device with a photoresistor, comprising:

a bipolar transistor (T2) having a base connected to said photoresistor;

an integrating capacitor (C2) connected to a collector of said bipolar transistor so that a collector current of said bipolar transistor is integrated in said capacitor for a scan period; and discharge means having an electronic switch (T3) connected to said collector for discharging said integrating capacitor at an end of said scan period to a preset reference potential ($U_o$).

9. The input amplifier of claim 8, which further comprises a charge equalization circuit (T4) connected to said collector for performing charge equalization for said collector current when said electronic switch (T3) is off.

* * * * *